US012719443B2

(12) United States Patent
Higuchi et al.

(10) Patent No.: US 12,719,443 B2
(45) Date of Patent: Aug. 25, 2026

(54) RESONANCE DEVICE WITH ANTI-DIFFUSION LAYER AND RESONANCE DEVICE MANUFACTURING METHOD

(71) Applicant: Murata Manufacturing Co., Ltd., Nagaokakyo (JP)

(72) Inventors: Yoshiyuki Higuchi, Nagaokakyo (JP); Masakazu Fukumitsu, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 825 days.

(21) Appl. No.: 18/175,954

(22) Filed: Feb. 28, 2023

(65) Prior Publication Data

US 2023/0208392 A1 Jun. 29, 2023

Related U.S. Application Data

(63) Continuation of application No. PCT/JP2021/025075, filed on Jul. 2, 2021.

(30) Foreign Application Priority Data

Nov. 6, 2020 (JP) ................................ 2020-185834

(51) Int. Cl.
*H03H 9/17* (2006.01)
*H03H 3/007* (2006.01)
*H03H 3/02* (2006.01)

(52) U.S. Cl.
CPC .......... *H03H 9/171* (2013.01); *H03H 3/0072* (2013.01); *H03H 3/02* (2013.01)

(58) Field of Classification Search
None
See application file for complete search history.

(56) References Cited

U.S. PATENT DOCUMENTS 7,628,309 B1 * 12/2009 Eriksen ............... H10P 90/1906 228/225
10,497,747 B2 * 12/2019 Tsai ....................... H10N 30/07
10,934,161 B2 * 3/2021 Fukumitsu .......... B81C 1/00269
11,881,838 B2 * 1/2024 Dehara ................ H03H 9/2457
(Continued)

FOREIGN PATENT DOCUMENTS

CN 107848789 B * 10/2020 ........... H03H 9/1057
EP 3012220 A1 * 4/2016 ............. B81C 3/001
(Continued)

OTHER PUBLICATIONS

International Search Report in PCT/JP2021/025075, mailed Sep. 28, 2021, 3 pages.

*Primary Examiner* — William J Klimowicz
(74) *Attorney, Agent, or Firm* — ArentFox Schiff LLP

(57) ABSTRACT

A resonance device that includes a MEMS substrate, a top cover, and a bonding part. The MEMS substrate includes a resonator. The bonding part is electrically conductive and bonds the MEMS substrate and the top cover to each other. The MEMS substrate further includes a wiring line layer and an anti-diffusion layer. The wiring line layer is electrically connected to a Si substrate serving as a lower electrode of the resonator. The anti-diffusion layer electrically connects the wiring line layer and the bonding part to each other.

18 Claims, 14 Drawing Sheets

(56) References Cited

U.S. PATENT DOCUMENTS

| | | | | |
|---|---|---|---|---|
| 2006/0145310 | A1* | 7/2006 | Park | G01D 21/00 257/664 |
| 2006/0214574 | A1* | 9/2006 | Kawaguchi | H10H 20/835 257/E33.068 |
| 2006/0249847 | A1* | 11/2006 | Eriksen | C23C 14/022 438/653 |
| 2007/0170819 | A1* | 7/2007 | Kuwahara | H03H 9/1021 310/344 |
| 2010/0047491 | A1* | 2/2010 | Eriksen | H10P 90/1906 428/34.1 |
| 2012/0094435 | A1* | 4/2012 | Nasiri | B81C 1/00238 438/455 |
| 2013/0240937 | A1* | 9/2013 | Chae | H10H 20/841 257/98 |
| 2016/0240758 | A1* | 8/2016 | Huang | H10H 20/841 |
| 2017/0252855 | A1* | 9/2017 | Fukumitsu | B06B 1/0603 |
| 2018/0048284 | A1* | 2/2018 | Nakamura | H03H 9/2452 |
| 2018/0048286 | A1* | 2/2018 | Goto | H03H 9/1057 |
| 2018/0127268 | A1 | 5/2018 | Fukumitsu et al. | |
| 2019/0089321 | A1* | 3/2019 | Morinaga | H03H 9/1014 |
| 2020/0290865 | A1* | 9/2020 | Umeda | H03H 3/0072 |
| 2021/0152148 | A1* | 5/2021 | Dehara | H03H 9/1057 |
| 2021/0194454 | A1 | 6/2021 | Umeda et al. | |
| 2024/0308841 | A1* | 9/2024 | Fujita | B81B 7/007 |

FOREIGN PATENT DOCUMENTS

| | | | | |
|---|---|---|---|---|
| WO | 2011111541 | A1 | 9/2011 | |
| WO | 2017047663 | A1 | 3/2017 | |
| WO | WO-2019155663 | A1 * | 8/2019 | H03H 9/0595 |
| WO | WO-2019159410 | A1 * | 8/2019 | B81B 7/0038 |
| WO | WO-2019225047 | A1 * | 11/2019 | B81B 7/0041 |
| WO | 2020085188 | A1 | 4/2020 | |

* cited by examiner 60
62
61
L31
F3
F2
F21
L1
V3
T4
75
240
L3
140a
V2
70
76B
236
235
34
120
E2
70
76A
110
E1
V1
V3
T4
140b
75
240
30
10
50
20
Z
Y
X

L3
L31
240
F3
F2
F21
L1
81
85
62
61
65
60
Z
Y
X

30
L31
V3
T4
L3
34
50
10
20
F3
F2
F21
L1
75
240
140a
V2
76B
236
235
120
E2
76A
110
E1
V1
140b
Z
Y
X

240
F3
F2
F21
L1
81
50
85
61

Y
Z
X

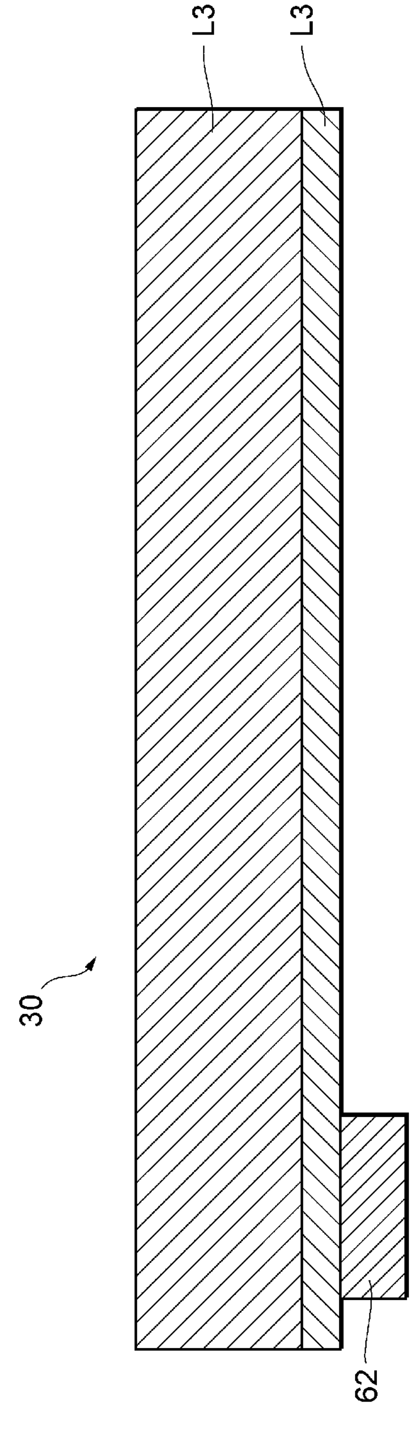
FIG. 12
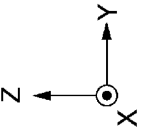

FIG. 14

RESONANCE DEVICE WITH ANTI-DIFFUSION LAYER AND RESONANCE DEVICE MANUFACTURING METHOD

CROSS REFERENCE TO RELATED APPLICATIONS

The present application is a continuation of International application No. PCT/JP2021/025075, filed Jul. 2, 2021, which claims priority to Japanese Patent Application No. 2020-185834, filed Nov. 6, 2020, the entire contents of each of which are incorporated herein by reference.

FIELD OF THE INVENTION

The present invention relates to a resonance device and a resonance device manufacturing method.

BACKGROUND OF THE INVENTION

Heretofore, resonance devices manufactured using micro electromechanical systems (MEMS) technologies have been widely used. This kind of device is, for example, formed by bonding an upper substrate to a lower substrate that is equipped with a resonator.

For example, Patent Document 1 discloses a MEMS device that includes a lower substrate equipped with a resonator, an upper substrate provided opposite the resonator, and a bonding part that bonds the lower substrate and the upper substrate to each other around the periphery of the resonator. The bonding part has a region that contains a hypereutectic alloy and a region that contains a eutectic alloy. In this MEMS device, the hypereutectic alloy covers the eutectic alloy and thereby prevents the metal from protruding from the bonding surface of the eutectic bond.

Patent Document 1: International Publication No. 2017/047663

SUMMARY OF THE INVENTION

The characteristics of MEMS devices may be improved by connecting the bonding part to ground (GND) in order to suppress the generation of parasitic capacitances (stray capacitances). In this case, the bonding part is connected to a lower electrode of the resonator by an aluminum (Al) wiring line having good electrical connectivity.

However, there is a risk of the metal constituting the bonding part, for example, germanium (Ge), diffusing into the aluminum wiring line during bonding and flowing to the side of the resonator where the lower electrode is located. Therefore, the ratio of metals constituting the bonding part may change and this may result in a change in the eutectic ratio or an insufficient eutectic reaction. As a result, bonding defects such as the bonding strength of the bonding part being reduced may occur.

The present invention was made in light of the above-described circumstances and one object thereof is to provide a resonance device and a resonance device manufacturing method that enable bonding defects of a bonding part to be suppressed.

A resonance device according to an aspect of the present invention includes: a first substrate that includes a resonator having a lower electrode and a wiring line layer electrically connected to the lower electrode; a second substrate; a bonding part that is electrically conductive and bonds the first substrate and the second substrate to each other; and an anti-diffusion layer that electrically connects the wiring line layer and the bonding part to each other.

A resonance device manufacturing method according to another aspect of the present invention includes: preparing a first substrate including a first metal layer, a resonator, a wiring line layer electrically connected to a lower electrode of the resonator, and an anti-diffusion layer electrically connecting the wiring line layer to the first metal layer; preparing a second substrate including a second metal layer; and bonding the first substrate and the second substrate to each other with a bonding part that includes a eutectic layer, the eutectic layer having a eutectic alloy of a first metal of the first metal layer and a second metal of the second metal layer as a main component.

According to the present invention, bonding defects of a bonding part can be suppressed.

BRIEF DESCRIPTION OF THE DRAWINGS

FIG. 12 is a main part enlarged sectional view for describing a step illustrated in FIG. 6.

FIG. 14 is a main part enlarged sectional view schematically illustrating a Third Modification of a bonding part illustrated in FIG. 5.

DETAILED DESCRIPTION OF THE PREFERRED EMBODIMENTS

Hereafter, an embodiment of the present invention will be described. In the following description of the drawings, identical or similar constituent elements are denoted by identical or similar reference symbols. The drawings are representative, the dimensions and shapes of the individual parts are schematically illustrated, and the technical scope of the present invention should not be interpreted as being limited to that of the embodiment.

Embodiment

Figure 1:
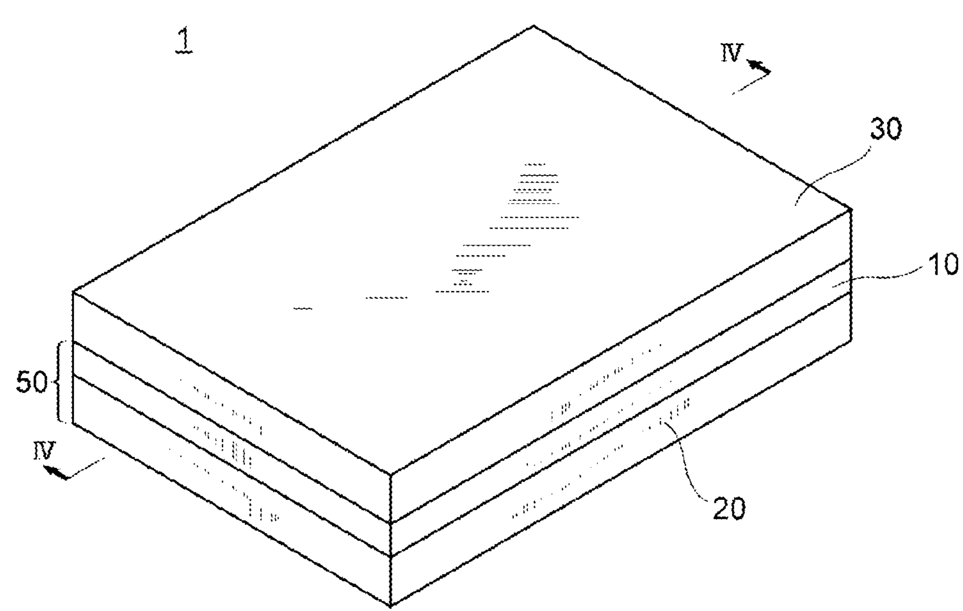
FIG. 1 is a perspective view schematically illustrating the exterior of a resonance device according to an embodiment of the present invention.
Figure 2:
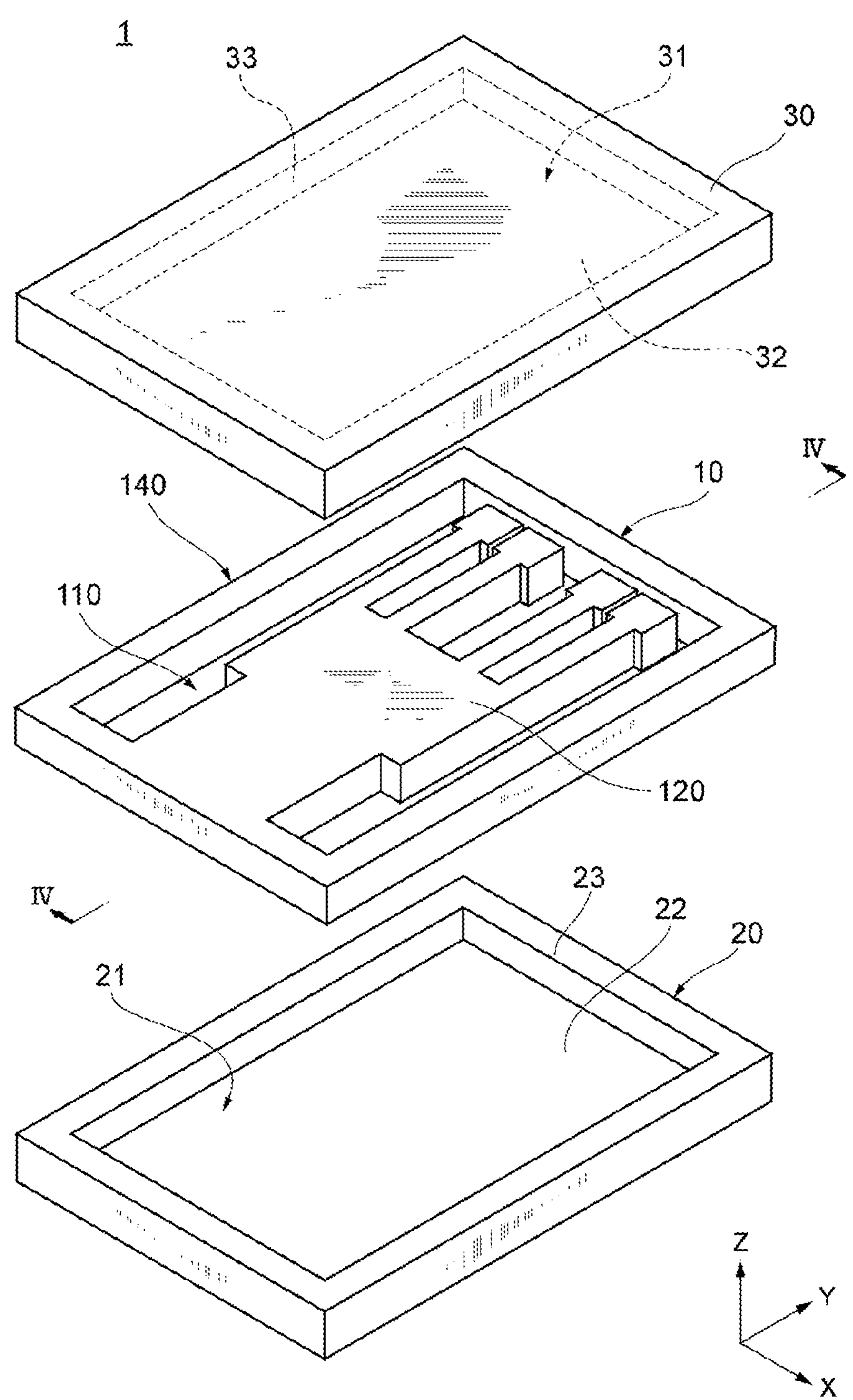
FIG. 2 is an exploded perspective view schematically illustrating the structure of the resonance device illustrated in FIG. 1.

First, the basic configuration of a resonance device according to an embodiment of the present invention will be described while referring to FIGS. 1 and 2. FIG. 1 is a perspective view schematically illustrating the exterior of a resonance device 1 according to an embodiment. FIG. 2 is an exploded perspective view schematically illustrating the structure of the resonance device 1 illustrated in FIG. 1.

The resonance device 1 includes a bottom cover 20, a resonator 10 (hereafter, the bottom cover 20 and the resonator 10 are also collectively referred to as a "MEMS substrate 50"), and a top cover 30. In other words, the resonance device 1 is formed by stacking the MEMS substrate 50, a bonding part 60, and the top cover 30 in this order. The MEMS substrate 50 corresponds to an example of a "first substrate" of the present invention and the top cover 30 corresponds to an example of a "second substrate" of the present invention.

Hereafter, the configuration of each part of the resonance device 1 will be described. Note that in the following description, the side of the resonance device 1 where the top cover 30 is provided is referred to as "top" (or "front") and the side of the resonance device 1 where the bottom cover 20 is provided is referred to as "bottom" (or "rear").

The resonator 10 is a MEMS vibrator manufactured using a MEMS technology. The resonator 10 and the top cover 30 are bonded to each other by the bonding part 60, which is described later. In addition, the resonator 10 and the bottom cover 20 are each formed using a silicon (Si) substrate (hereafter also referred to as a "Si substrate") and these Si substrates are bonded to each other. The MEMS substrate 50 (resonator 10 and bottom cover 20) may be formed using an SOI substrate.

The top cover 30 extends in a flat plate shape along the XY plane and a recess 31, which for example has a flat rectangular parallelepiped shape, is formed in the rear surface of the top cover 30. The recess 31 is surrounded by a side wall 33 and the recess 31 forms part of a vibration space, which is a space in which the resonator 10 vibrates. In addition, a getter layer 34, which is described later, is formed on a surface of the recess 31, which is on the side near the resonator 10, of the top cover 30. The top cover 30 may instead be configured as a flat plate without the recess 31.

The bottom cover 20 includes a rectangular flat plate shaped bottom plate 22, which is provided along the XY plane, and a side wall 23, which extends in the Z axis direction from the periphery of the bottom plate 22, i.e., in the direction in which the bottom cover 20 and the resonator 10 are stacked. A recess 21, which is formed by the front surface of the bottom plate 22 and the inner surface of the side wall 23, is formed in the surface of the bottom cover 20 that faces the resonator 10. The recess 21 forms part of the vibration space of the resonator 10. The bottom cover 20 may instead be configured as a flat plate without the recess 21. In addition, a getter layer may be formed on the surface of the recess 21, which is on the side near the resonator 10, of the bottom cover 20.

Figure 3:
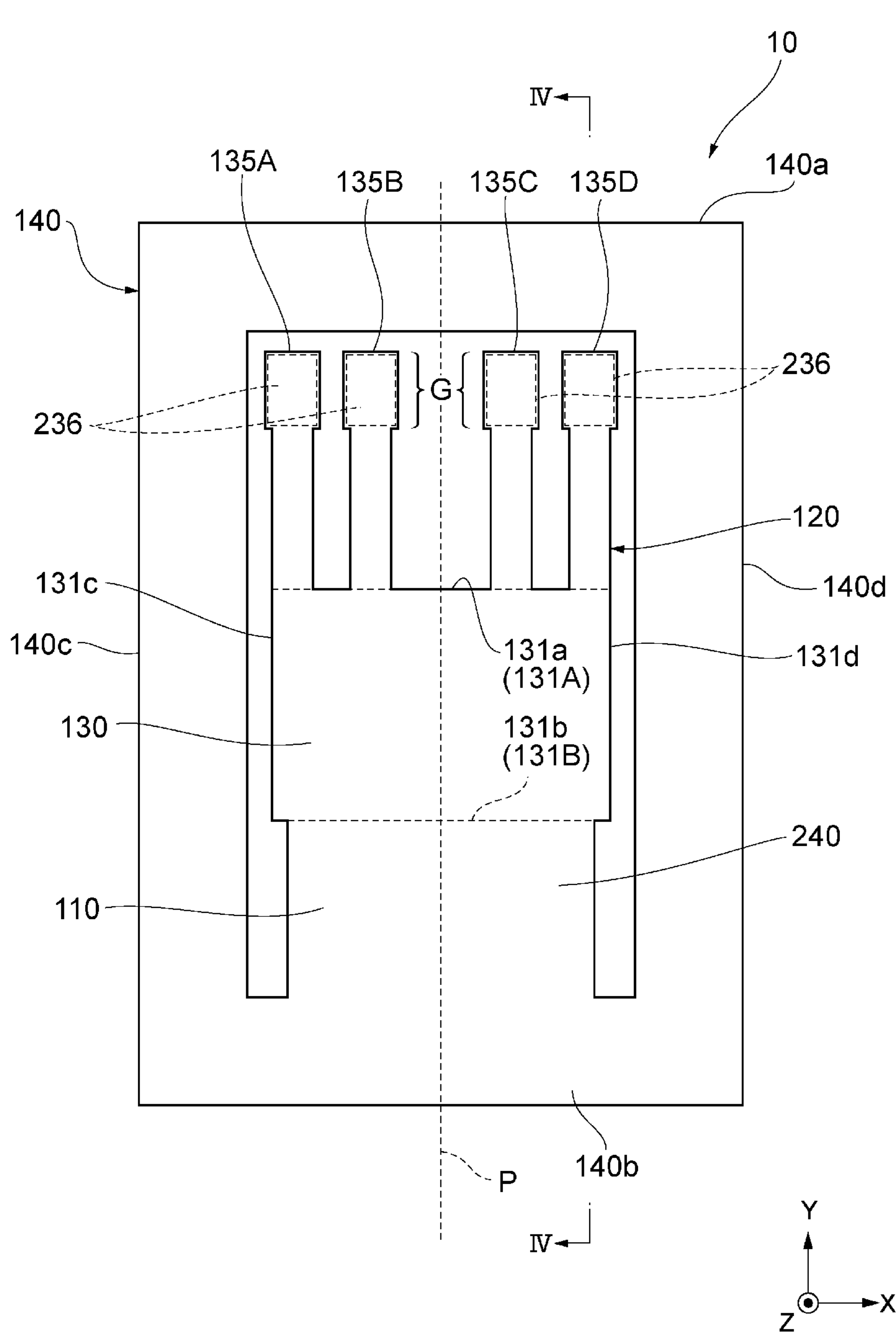
FIG. 3 is a plan view schematically illustrating the structure of a resonator illustrated in FIG. 2.

Next, the basic configuration of the resonator included in the resonance device according to the embodiment of the present invention will be described while referring to FIG. 3. FIG. 3 is a plan view schematically illustrating the structure of the resonator 10 illustrated in FIG. 2.

As illustrated in FIG. 3, the resonator 10 is a MEMS vibrator manufactured using MEMS technology and undergoes out-of-plane vibration in the XY plane in the Cartesian coordinate system in FIG. 3. Note that the resonator 10 does not have to be a resonator using an out-of-plane bending vibration mode. The resonator of the resonance device 1 may, for example, use a spreading vibration mode, a thickness longitudinal vibration mode, a Lamb wave vibration mode, an in-plane bending vibration mode, or a surface acoustic wave vibration mode. These vibrators are applied, for example, to timing devices, RF filters, duplexers, ultrasonic transducers, gyroscopic sensors, accelerometers, and so forth. Furthermore, the vibrators may also be used in piezoelectric mirrors having actuator functions, piezoelectric gyros, piezoelectric microphones having pressure sensor functions, ultrasonic vibration sensors, and so on. In addition, the vibrators may be applied to electrostatic MEMS elements, electromagnetic driving MEMS elements, and piezo-resistance MEMS elements.

The resonator 10 includes a vibrating portion 120, a holding portion 140, and a holding arm 110.

The holding portion 140 is formed in a rectangular frame shape so as to surround the outside of the vibrating portion 120 along the XY plane. For example, the holding portion 140 is integrally formed from a prism-shaped frame. Note that it is sufficient that the holding portion 140 be provided along at least part of the periphery of the vibrating portion 120 and the holding portion 140 is not limited to having a frame-like shape.

The holding arm 110 is provided on the inner side of the holding portion 140 and connects the vibrating portion 120 and the holding portion 140 to each other.

The vibrating portion 120 is provided on the inner side of the holding portion 140 and a space is formed between the vibrating portion 120 and the holding portion 140 with a predetermined spacing. In the example illustrated in FIG. 3, the vibrating portion 120 includes a base portion 130 and four vibrating arms 135A to 135D (hereafter, also collectively referred to as "vibrating arms 135"). Note that the number of vibrating arms is not limited to four and a desired number of vibrating arms such as one or more may be provided. In this embodiment, the vibrating arms 135A to 135D and the base portion 130 are formed so as to be integrated with each other.

In plan view, the base portion 130 has long sides 131*a* and 131*b* that extend in the X axis direction and short sides 131*c* and 131*d* that extend in the Y axis direction. The long side 131*a* is one side of the surface of the front end of the base portion 130 (hereafter, also referred to as "front end 131A") and the long side 131*b* is one side of the surface of the rear end of the base portion 130 (hereafter, referred to as "rear end 131B"). The front end 131A and the rear end 131B of the base portion 130 are provided so as to face each other.

The base portion 130 is connected to the vibrating arms 135 at the front end 131A and is connected to the holding arm 110, which is described later, at the rear end 131B. The base portion 130 has a substantially rectangular shape in plan view in the example illustrated in FIG. 3, but is not limited to this shape. It is sufficient that the base portion 130 be formed so as to substantially have planar symmetry with respect to a virtual plane P defined along a vertical bisector of the long side 131*a*. For example, the base portion 130 may have a trapezoidal shape in which the long side 131*b* is shorter than the long side 131*a* or the base portion 130 may have a semi-circular shape in which the long side 131*a* is the diameter. Furthermore, the surfaces of the base portion 130 are not limited to being flat surfaces and may be curved surfaces. The virtual plane P is a plane that extends through the center, in the direction in which the vibrating arms 135 are arrayed, of the vibrating portion 120.

In the base portion 130, a base portion length, which is the longest distance between the front end 131A and the rear end 131B in the direction from the front end 131A to the rear end 131B, is around 35 μm. Furthermore, a base portion width, which is the longest distance between side edges of the base portion 130 in a width direction perpendicular to the base portion length direction, is around 265 μm.

The vibrating arms 135 extend in the Y axis direction and have the same size as each other. The vibrating arms 135 are provided parallel to the Y axis direction between the base portion 130 and the holding portion 140 and first ends thereof are fixed ends that are connected to the front end 131A of the base portion 130 and second ends thereof are open ends. In addition, the vibrating arms 135 are provided parallel to each other with a prescribed interval therebetween in the X axis direction. The vibrating arms 135, for example, have a width of around 50 μm in the X axis direction and a length of around 465 μm in the Y axis direction.

Part of each vibrating arm 135 extending around 150 μm from the open end is wider in the X axis direction than the other part of the vibrating arm 135. This wider part is called a weight portion G. Each weight portion G is, for example, 10 μm wider on each side in the X-axis direction than the other portion of the vibrating arm 135 and has a width of around 70 μm in the X-axis direction. The weight portions G are integrally formed using the same process as for the vibrating arms 135. As a result of forming the weight portions G, the vibrating arms 135 have a higher weight per unit length at the open ends thereof than at the fixed ends thereof. Therefore, the amplitude of the vibration in the vertical direction in each vibrating arm can be increased due to each of the vibrating arms 135 having the weight portion G at the open end thereof.

A protective film 235, which is described later, is formed so as to cover the entire front surface of the vibrating portion 120 (the surface facing the top cover 30). In addition, a frequency-adjusting film 236 is formed on the front surface of the protective film 235 on the tips, on the open-end side, of the vibrating arms 135A to 135D. The resonant frequency of the vibrating portion 120 can be adjusted using the protective film 235 and the frequency-adjusting film 236.

In this embodiment, substantially the entirety of the front surface of the resonator 10 (surface on the side facing the top cover 30) is covered by the protective film 235. In addition, substantially the entire front surface of the protective film 235 is covered by a parasitic capacitance reducing film 240. However, it is sufficient that the protective film 235 cover at least the vibrating arms 135 and the protective film 235 is not limited to being formed so as to cover substantially the entire surface of the resonator 10.

Figure 4:
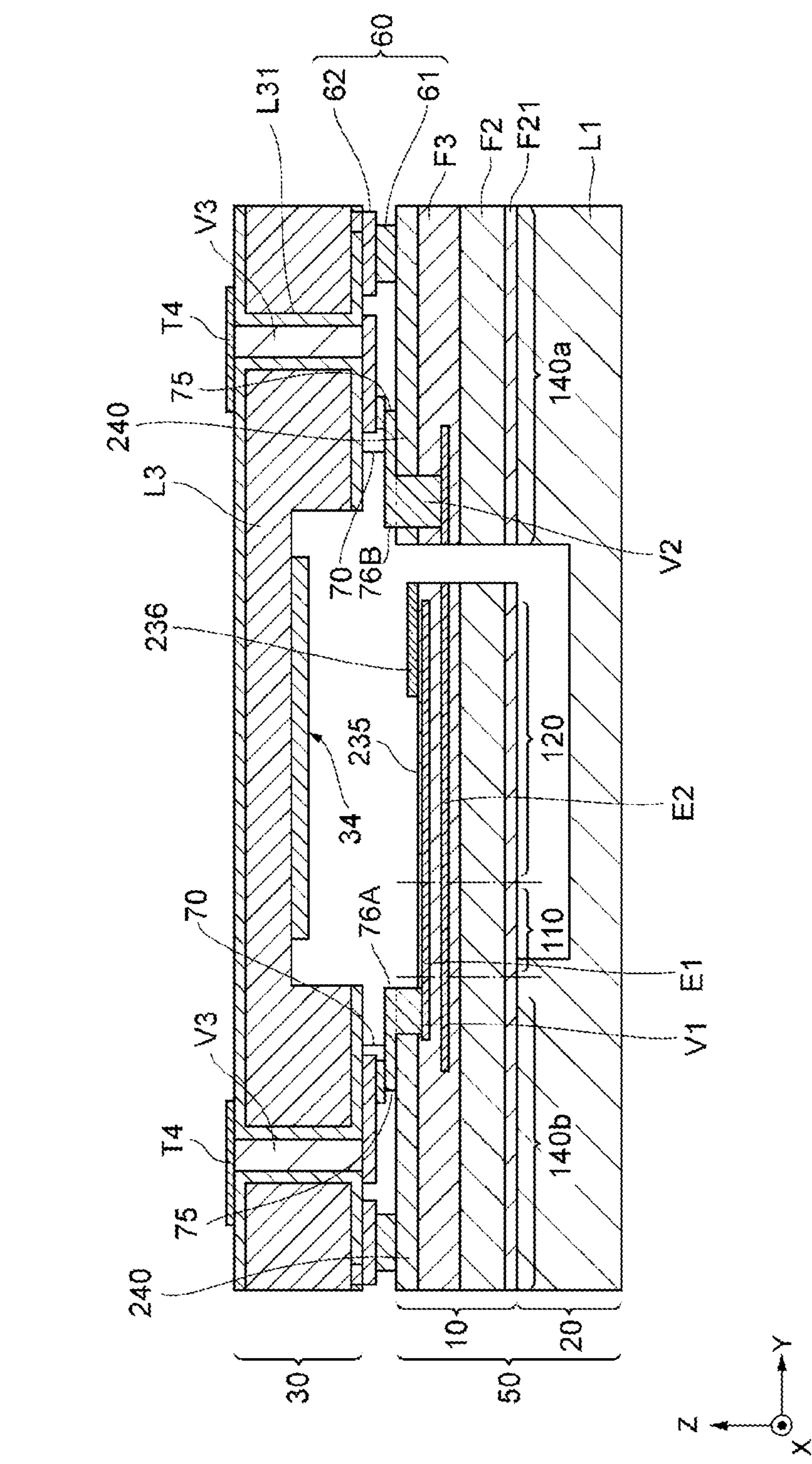
FIG. 4 is a sectional view schematically illustrating the configuration of a cross section of the resonance device illustrated in FIGS. 1 to 3 taken along the line IV-IV.

Next, the multilayer structure of the resonance device 1 according to the embodiment of the present invention will be described while referring to FIG. 4. FIG. 4 is a sectional view schematically illustrating the configuration of a cross section of the resonance device 1 illustrated in FIGS. 1 to 3 taken along the line IV-IV.

As illustrated in FIG. 4, in the resonance device 1, the holding portion 140 of the resonator 10 is bonded to the top of the side wall 23 of the bottom cover 20 and furthermore, the holding portion 140 of the resonator 10 and the side wall 33 of the top cover 30 are bonded to each other. Thus, the resonator 10 is held between the bottom cover 20 and the top cover 30 and a vibration space in which the vibrating arms 135 vibrate is formed by the bottom cover 20, the top cover 30, and the holding portion 140 of the resonator 10. In addition, a terminal T4 is formed on the top surface of the top cover 30 (surface on opposite side from surface facing resonator 10). The terminal T4 and the resonator 10 are electrically connected to each other by a through electrode V3, a connection wiring line 70, and contact electrodes 76A and 76B.

The top cover 30 is formed of a Si substrate L3 having a prescribed thickness. The top cover 30 is bonded to the holding portion 140 of the resonator 10 by the bonding part 60, which is described later, along the periphery (side wall 33) thereof. The surface of the top cover 30 facing the resonator 10 is covered by a silicon oxide film L31. The silicon oxide film L31 is, for example, composed of silicon dioxide ($SiO_2$) and is formed on the surface of the Si substrate L3 by oxidizing the surface of the Si substrate L3 or by performing chemical vapor deposition (CVD). It is preferable that the rear surface of the top cover 30 and the side surface of the through electrode V3 also be covered by the silicon oxide film L31.

In addition, a getter layer 34 is formed on the surface of the recess 31, which is on the side facing the resonator 10, of the top cover 30. The getter layer 34 is, for example, formed of titanium (Ti) and absorbs outgas generated in the vibration space. As a result of forming the getter layer 34 over substantially the entire surface of the recess 31, on the side facing the resonator 10, in the top cover 30 according to this embodiment, it is possible to suppress a decrease in the degree of vacuum of the vibration space.

Furthermore, the through electrode V3 of the top cover 30 is formed by filling a through hole formed in the top cover 30 with an electrically conductive material. The filled electrically conductive material is, for example, impurity-doped polycrystalline silicon (Poly-Si), copper (Cu), gold (Au), or impurity-doped monocrystalline silicon. The through electrode V3 serves as a wiring line that electrically connects the terminal T4 and a voltage application part 141 to each other.

The bottom plate 22 and the side wall 23 of the bottom cover 20 are integrally formed by a Si wafer L1. In addition, the bottom cover 20 is bonded to the holding portion 140 of the resonator 10 by the top surface of the side wall 23. The thickness of the bottom cover 20 defined in the Z axis direction is, for example, 150 μm and the depth of the recess 21 is, for example, 50 μm. In addition, the Si wafer L1 is formed of non-degenerate silicon and the resistivity thereof is 16 mΩ·cm or higher, for example.

The holding portion 140, the base portion 130, the vibrating arms 135, and the holding arm 110 of the resonator 10 are integrally formed with each other using the same process. In the resonator 10, a piezoelectric thin film F3 is formed on a Si substrate F2, which is an example of a substrate, so as to cover the Si substrate F2, and furthermore, a metal layer E2 is stacked on the piezoelectric thin film F3. In addition, the piezoelectric thin film F3 is stacked on the metal layer E2 so as to cover the metal layer E2, and furthermore, a metal layer E1 is stacked on the piezoelectric thin film F3. The protective film 235 is stacked on the metal layer E1 so as to cover the metal layer E1 and the parasitic capacitance reducing film 240 is stacked on the protective film 235. The external shapes of each of the holding portion 140, the base portion 130, the vibrating arms 135, and the holding arm 110 are formed by subjecting a multilayer body consisting of the Si substrate F2, the piezoelectric thin film F3, the metal layer E2, the metal layer E1, the protective film 235, and so on to removal processing and patterning in which the multilayer body is dry etched by radiating an argon (Ar) ion beam.

The Si substrate F2 may be formed from a degenerate n-type silicon (Si) semiconductor having a thickness of around 6 μm, for example. The degenerate silicon (Si) can contain phosphorus (P), arsenic (As), antimony (Sb), and so on as n-type dopants. The resistance of the degenerate silicon (Si) used in the Si substrate F2 is, for example, less than 16 mΩ·cm and more preferably is 1.2 mΩ·cm or less.

Thus, the Si substrate F2 is composed of degenerate silicon (Si). Using a degenerate silicon substrate, which has a low resistance value, allows the Si substrate F2 itself to serve as the lower electrode of the resonator 10. In this case, the above-mentioned metal layer E2 is omitted.

As an example of a temperature characteristic correcting layer, a silicon oxide layer F21, which is for example composed of silicon dioxide ($SiO_2$), is formed on the bottom surface of the Si substrate F2. This enables the temperature characteristics to be improved. Note that the silicon oxide layer F21 may instead be formed on the top surface of the Si substrate F2 or may be formed on both the top surface and the bottom surface of the Si substrate F2.

In addition, the metal layers E1 and E2, for example, have a thickness of around 0.1 μm to 0.2 μm and are patterned into desired shapes using etching or the like after being deposited. Metals having a body-centered cubic crystal structure are used for the metal layers E1 and E2. Specifically, the metal layers E1 and E2 are formed using molybdenum (Mo), tungsten (W), or the like.

The metal layer E1 is, for example, formed on the vibrating portion 120 so as to serve as an upper electrode. In addition, the metal layer E1 is formed on the holding arm 110 and the holding portion 140 so as to serve as a wiring line for connecting the upper electrode to an AC power source provided outside the resonator 10.

On the other hand, the metal layer E2 is formed on the vibrating portion 120 so as to serve as a lower electrode. Furthermore, the metal layer E2 is formed on the holding arm 110 and the holding portion 140 so as to serve as a wiring line for connecting the lower electrode to a circuit provided outside the resonator 10.

The piezoelectric thin film F3 is a thin film composed of a piezoelectric material that converts voltages applied thereto into vibrations. The piezoelectric thin film F3 is formed of a material having a wurtzite-type hexagonal crystal structure and for example can have a nitride or an oxide as a main constituent such as aluminum nitride (AlN), scandium aluminum nitride (ScAlN), zinc oxide (ZnO), gallium nitride (GaN), or indium nitride (InN). Scandium aluminum nitride is a substance obtained by replacing some of the aluminum in aluminum nitride with scandium, and instead of scandium, the aluminum may be replaced with two elements such as magnesium (Mg) and niobium (Nb) or magnesium (Mg) and zirconium (Zr). In addition, the piezoelectric thin film F3 has, for example, a thickness of 1 μm, but a thickness of around 0.2 μm to 2 μm may be used.

The piezoelectric thin film F3 expands and contracts in in-plane directions in the XY plane, i.e., in the Y axis direction, in accordance with an electric field applied to the piezoelectric thin film F3 by the metal layers E1 and E2. The free ends of the vibrating arms 135 are displaced toward the inner surfaces of the bottom cover 20 and the top cover 30 by the expansion and contraction of the piezoelectric thin film F3 and the vibrating arms 135 vibrate in an out-of-plane bending vibration mode.

In this embodiment, the phase of the electric field applied to the outer vibrating arms 135A and 135D and the phase of the electric field applied to the inner vibrating arms 135B and 135C are set so as to be opposite phases. This causes the outer vibrating arms 135A and 135D and the inner vibrating arms 135B and 135C to be displaced in opposite directions from each other. For example, when the free ends of the outer vibrating arms 135A and 135D are displaced toward the inner surface of the top cover 30, the free ends of the inner vibrating arms 135B and 135C are displaced toward the inner surface of the bottom cover 20.

The protective film 235 prevents oxidation of the metal layer E2, which is an upper electrode used for inducing piezoelectric vibrations. The protective film 235 is preferably formed of a material having a lower speed of mass reduction by etching than the frequency-adjusting film 236. The speed of mass reduction is expressed by the etching speed, i.e., the product of the thickness removed per unit time and the density. The protective film 235 is, for example, formed of a piezoelectric film composed of aluminum nitride (AlN), scandium aluminum nitride (ScAlN), zinc oxide (ZnO), gallium nitride (GaN), indium nitride (InN), or the like or an insulating film composed of silicon nitride (SiN), silicon oxide ($SiO_2$), alumina oxide ($Al_2O_3$), or the like. The thickness of the protective film 235 is, for example, around 0.2 μm.

The frequency-adjusting film 236 is formed only on prescribed regions by performing etching or the like after forming the frequency-adjusting film 236 over substantially the entire surface of the vibrating portion 120. The frequency-adjusting film 236 is formed of a material having a higher speed of mass reduction by etching than the protective film 235. Specifically, the frequency-adjusting film 236 is formed of a metal such as molybdenum (Mo), tungsten (W), gold (Au), platinum (Pt), nickel (Ni), or titanium (Ti).

Note that so long as the relationship between the mass reduction speeds of the protective film 235 and the frequency-adjusting film 236 is as described above, the relationship between the magnitudes of the etching speeds may be set as desired.

The parasitic capacitance reducing film 240 is formed of tetraethyl orthosilicate (TEOS). The thickness of the parasitic capacitance reducing film 240 is around 1 μm. As well as reducing parasitic capacitances at lead-out wiring parts, the parasitic capacitance reducing film 240 functions as an insulating layer for when wiring lines of different potentials cross each other and functions as a stand off film for increasing the vibration space.

The connection wiring line 70 is electrically connected to the terminal T4 via the through electrode V3 and is electrically connected to the contact electrodes 76A and 76B.

The contact electrode 76A is formed so as to contact the metal layer E1 of the resonator 10 and electrically connects the connection wiring line 70 and the resonator 10 to each other. The contact electrode 76B is formed so as to contact the metal layer E2 of the resonator 10 and electrically connects the connection wiring line 70 and the resonator 10 to each other. Specifically, when connecting the contact electrode 76A and the metal layer E1 to each other, a portion of each of the piezoelectric thin film F3, the protective film 235, and the parasitic capacitance reducing film 240 stacked on the metal layer E1 is removed in order to expose the metal layer E1 and a via V1 is formed. The inside of the formed via V1 is filled with the same material as the contact electrode 76A and the metal layer E1 and the contact electrode 76A are connected to each other. Similarly, when connecting the contact electrode 76B and the metal layer E2 to each other, portions of the piezoelectric thin film F3 and the parasitic capacitance reducing film 240 stacked on the metal layer E2 are removed in order to expose the metal layer E2 and a via V2 is formed. The inside of the formed via V2 is filled with the contact electrode 76B and the metal layer E2 and the contact electrode 76B are connected to each other. The contact electrodes 76A and 76B are, for example, formed of a metal such as aluminum (Al), gold (Au), or tin (Sn). It is preferable that the connection point between the metal layer E1 and the contact electrode 76A and the connection point between the metal layer E2 and the contact electrode 76B be located in a region outside the vibrating portion 120, and in this embodiment, these points are connected in the holding portion 140.

The bonding part 60 is formed in a rectangular annular shape along the XY plane around the periphery of the vibrating portion 120 of the resonator 10 between the MEMS substrate 50 (resonator 10 and bottom cover 20) and the top cover 30 on the holding portion 140, for example. The bonding part 60 bonds the MEMS substrate 50 and the top cover 30 to each other so as to seal the vibration space of the resonator 10. This enables the vibration space to be hermetically sealed and a vacuum state to be maintained.

In this embodiment, the bonding part 60 includes a first metal layer 61 formed on the MEMS substrate 50 and a second metal layer 62 formed on the top cover 30, and the MEMS substrate 50 and the top cover 30 are bonded to each other by the first metal layer 61 and the second metal layer 62 eutectically bonding with each other.

In this embodiment, an example has been described in which the bonding part 60 is provided along the entire periphery of the vibrating portion 120 in the resonator 10 so as to seal the vibration space of the resonator 10, but the present invention is not limited to this configuration. So long as the bonding part 60 bonds the MEMS substrate 50 and the top cover 30 to each other, for example, the bonding part 60 may be formed along only part of the periphery of the vibrating portion 120 in the resonator 10.

Figure 5:
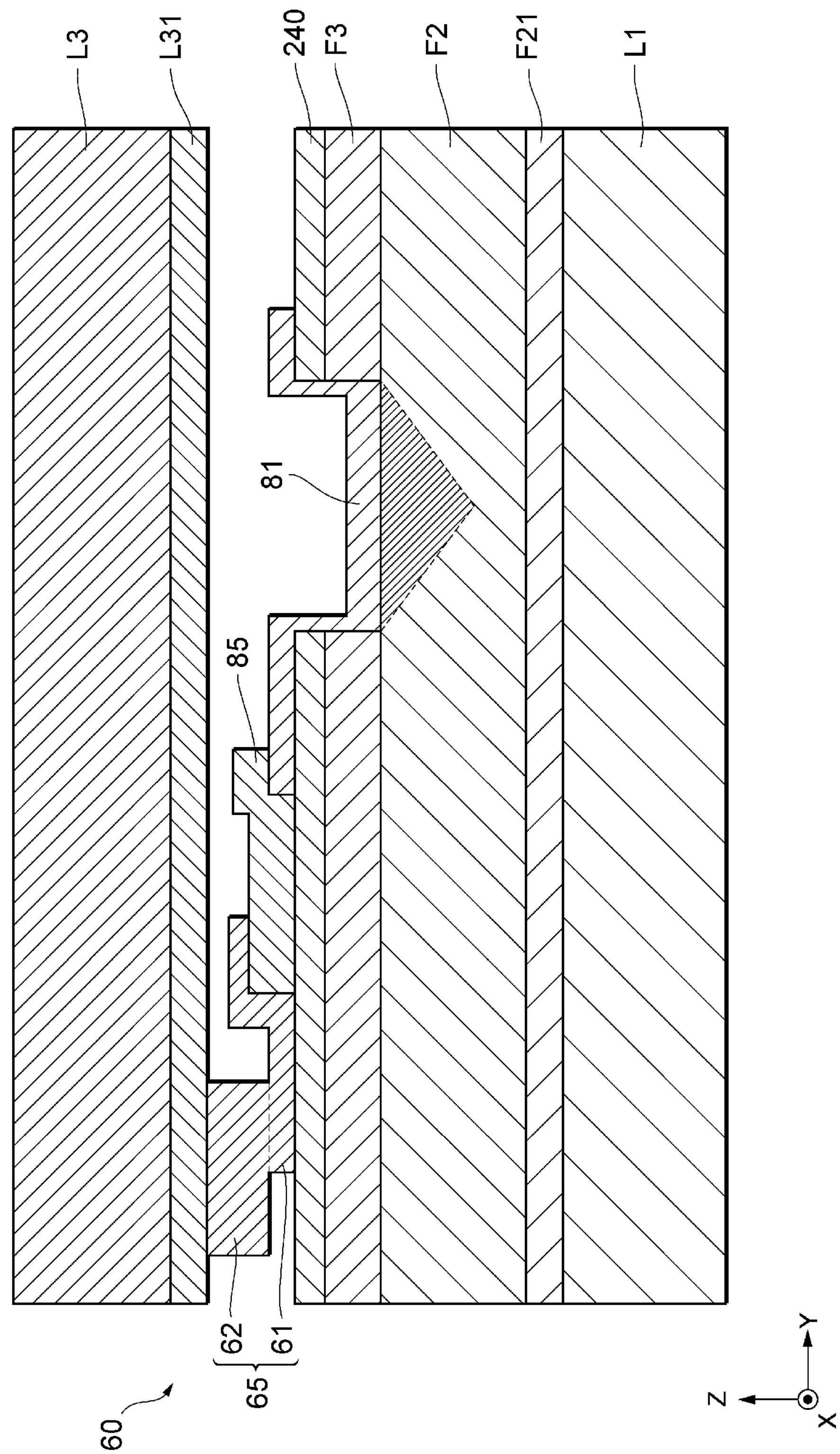
FIG. 5 is a main part enlarged sectional view schematically illustrating the configuration of a bonding part illustrated in FIG. 4 and the region around the bonding part.

Next, the configuration of the bonding part and the region around the bonding part in the resonance device according to the embodiment of the present invention will be described while referring to FIG. 5. FIG. 5 is a main part enlarged sectional view schematically illustrating the configuration of the bonding part 60 and the region around the bonding part 60 illustrated in FIG. 4. FIG. 5 is a cross section taken along the ZY plane, where the X-coordinate position is different from that of the cross section illustrated in FIG. 4. In the following description, unless stated otherwise, the Si substrate F2 is degenerate silicon (Si) and the Si substrate F2 itself serves as the lower electrode of the resonator 10. Therefore, the above-mentioned metal layer E1 is not included.

As illustrated in FIG. 5, the bonding part 60 includes a eutectic layer 65 having a eutectic alloy as a main component. The eutectic alloy of the eutectic layer 65 is, for example, a eutectic alloy of the first metal layer 61 having aluminum (Al) as a main component and the second metal layer 62 consisting of germanium (Ge).

In the example illustrated in FIG. 5, the first metal layer 61 and the second metal layer 62 are illustrated as separate layers, but in reality, there is eutectic bonding at the interface between these layers. In other words, the eutectic layer 65 mainly consists of a eutectic alloy of a first metal having aluminum (Al) as a main component and a second metal that is germanium (Ge). Thus, the bonding part 60 that is electrically conductive and strong can be easily realized as a result of the bonding part 60 including the eutectic layer 65 mainly composed of a eutectic alloy of the first metal of the first metal layer 61, which has aluminum (Al) as a main component, and the second metal of the second metal layer 62, which is germanium (Ge).

The first metal of the first metal layer 61 is composed of aluminum (Al), an aluminum-copper alloy (AlCu alloy), or an aluminum-silicon-copper alloy (AlSiCu alloy). Aluminum or an aluminum alloy can be easily eutectic bonded with the germanium (Ge) of the second metal layer 62 and for example, is a metal that is often used for wiring lines in resonance devices and the like. Therefore, the process of manufacturing the resonance device 1 can be simplified and the bonding part 60 that bonds the MEMS substrate 50 and the top cover 30 to each other can be easily formed.

In the following description, unless stated otherwise, the first metal of the first metal layer 61 is aluminum (Al), the second metal of the second metal layer 62 is germanium (Ge), and the eutectic layer 65 has aluminum-germanium as a main component. In this case, the eutectic layer 65 may include aluminum (Al) and germanium (Ge) in addition to aluminum-germanium.

In the vicinity of the bonding part 60, a wiring line layer 81 is provided on the parasitic capacitance reducing film 240. The wiring line layer 81 is configured so as to be electrically connected to the Si substrate F2, which is electrically conductive and serves as the lower electrode of the resonator 10. The wiring line layer 81 is formed by first removing part of the parasitic capacitance reducing film 240 and the piezoelectric thin film F3 so as to form a hole. The hole is then filled with an electrically conductive material and the electrically conductive material is electrically connected to the Si substrate F2.

An anti-diffusion layer 85 is provided on top of the parasitic capacitance reducing film 240. The anti-diffusion layer 85 is electrically conductive and is configured to electrically connect the wiring line layer 81 and the bonding part 60 to each other. The anti-diffusion layer 85 functions so as to inhibit and prevent the diffusion of the metals constituting the bonding part 60.

Thus, when the MEMS substrate 50 (resonator 10 and bottom cover 20) includes the wiring line layer 81 that is electrically connected to the Si substrate F2, which serves as the lower electrode of the resonator 10, the potential of the bonding part 60 can be dropped to a reference potential (GND) of the resonance device 1 via the anti-diffusion layer 85, and generation of a parasitic capacitance (stray capacitance) can be suppressed. As a result of the MEMS substrate 50 (resonator 10 and bottom cover 20) including the anti-diffusion layer 85 that electrically connects the wiring line layer 81 and the bonding part 60 to each other, the metal constituting the bonding part 60 can be prevented from diffusing into the wiring line layer 81 by the anti-diffusion layer 85 when the top cover 30 and the MEMS substrate 50 are bonded to each other. Therefore, changes in the metal ratio of the bonding part 60 caused by such diffusion can be reduced, and bonding defects of the bonding part 60 can be suppressed.

The wiring line layer 81 is formed at a position spaced apart from an end portion of the bonding part 60. In other words, the wiring line layer 81 is disposed so as to be spaced apart from an end portion of the bonding part 60 in the MEMS substrate 50 (resonator 10 and bottom cover 20). This allows the anti-diffusion layer 85 to be disposed between the bonding part 60 and the wiring line layer 81. Therefore, the anti-diffusion layer 85 can be made thinner than in a case where the anti-diffusion layer 85 is formed directly below the bonding part 60, as described below, and the manufacturing cost of the resonance device 1 can be reduced.

The material of wiring line layer 81 is preferably a metal having aluminum (Al) as a main component. A metal having aluminum (Al) as a main component is, for example, aluminum (Al), an aluminum-copper alloy (AlCu alloy), or an aluminum-silicon-copper alloy (AlSiCu alloy). This allows an oxide film formed on the surface of the Si substrate F2, which serves as the lower electrode of the resonator 10, to be removed (reduced) by a heat treatment at a relatively low temperature, for example, 450° C.

The material of wiring line layer 81 is not limited to a metal having aluminum as a main component. For example, the material of wiring line layer 81 may be a metal such as titanium (Ti).

When the wiring line layer 81 consists of a metal having aluminum as a main component, aluminum (Al) and silicon (Si) are able to interdiffuse at the interface between the wiring line layer 81 and the Si substrate F2, thereby generating a so-called alloy spike, as illustrated in FIG. 5 by the dashed lines. In this case, the silicon in the Si substrate F2 easily diffuses into the bonding part 60, and this makes the role of the anti-diffusion layer 85 between the Si substrate F2 and the bonding part 60 even more important.

The anti-diffusion layer 85 consists of a metal that has low diffusivity with respect to the metal of the bonding part 60. The material of the anti-diffusion layer 85 is preferably, for example, molybdenum (Mo) or tungsten (W). This enables diffusion of aluminum (Al) and germanium (Ge) of the eutectic layer 65 to be easily inhibited.

In the following description, unless stated otherwise, the material of wiring line layer 81 is aluminum (Al) and the material of anti-diffusion layer 85 is molybdenum (Mo).

Figure 6:
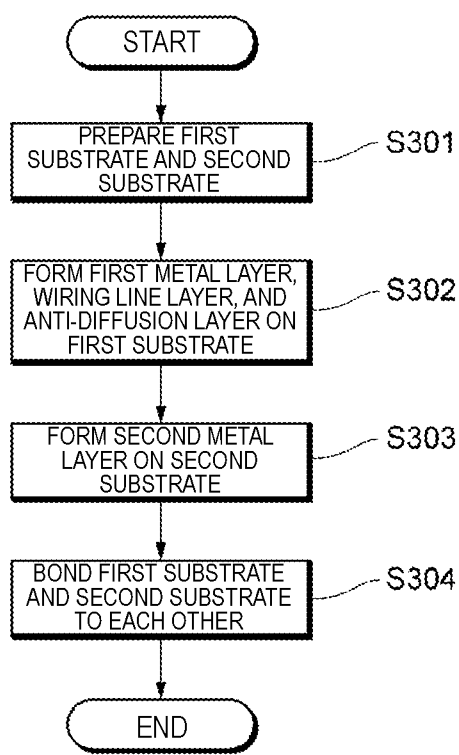
FIG. 6 is a flowchart illustrating a resonance device manufacturing method according to an embodiment.
Figure 7:
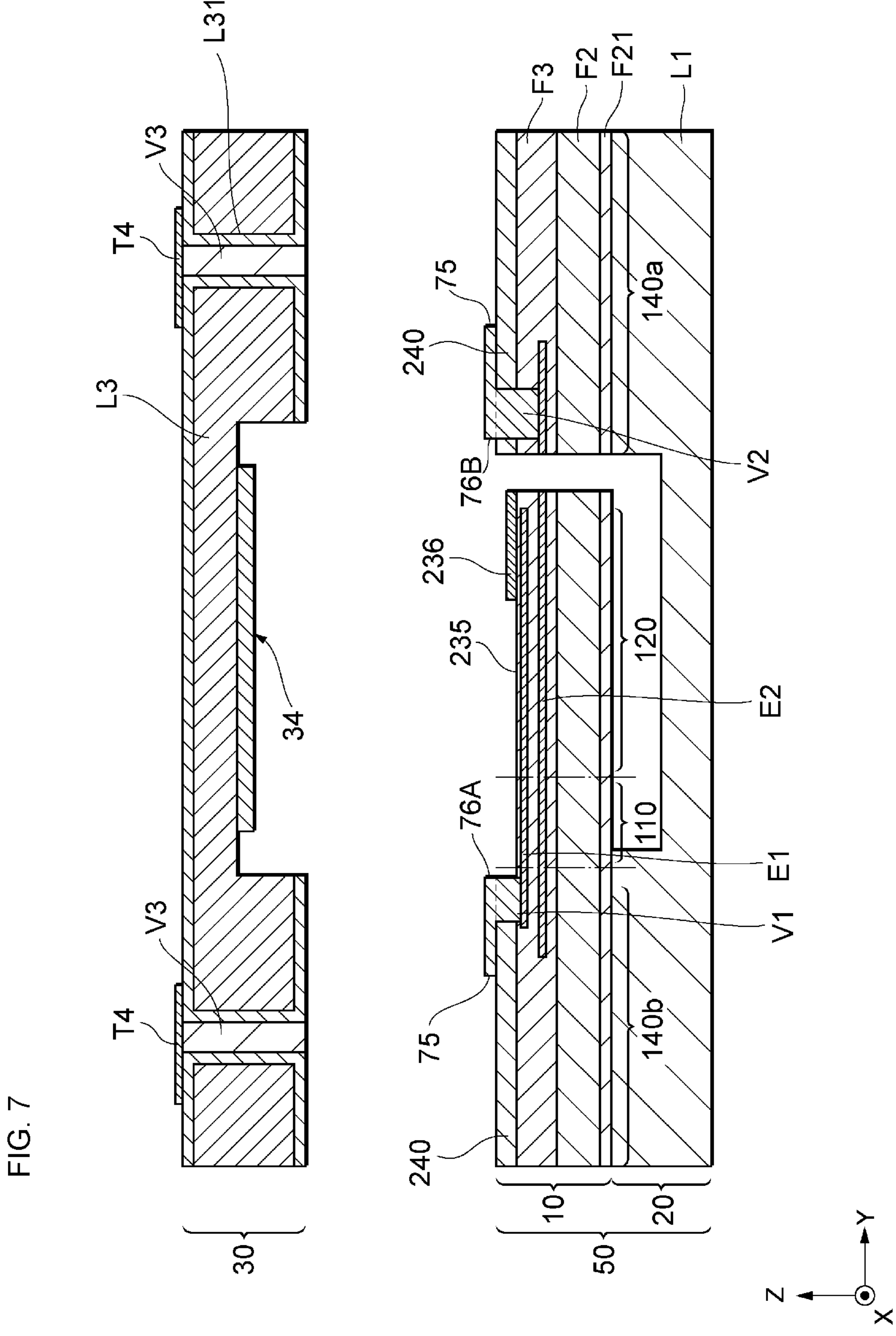
FIG. 7 is a sectional view for describing a step illustrated in FIG. 6.
Figure 8:
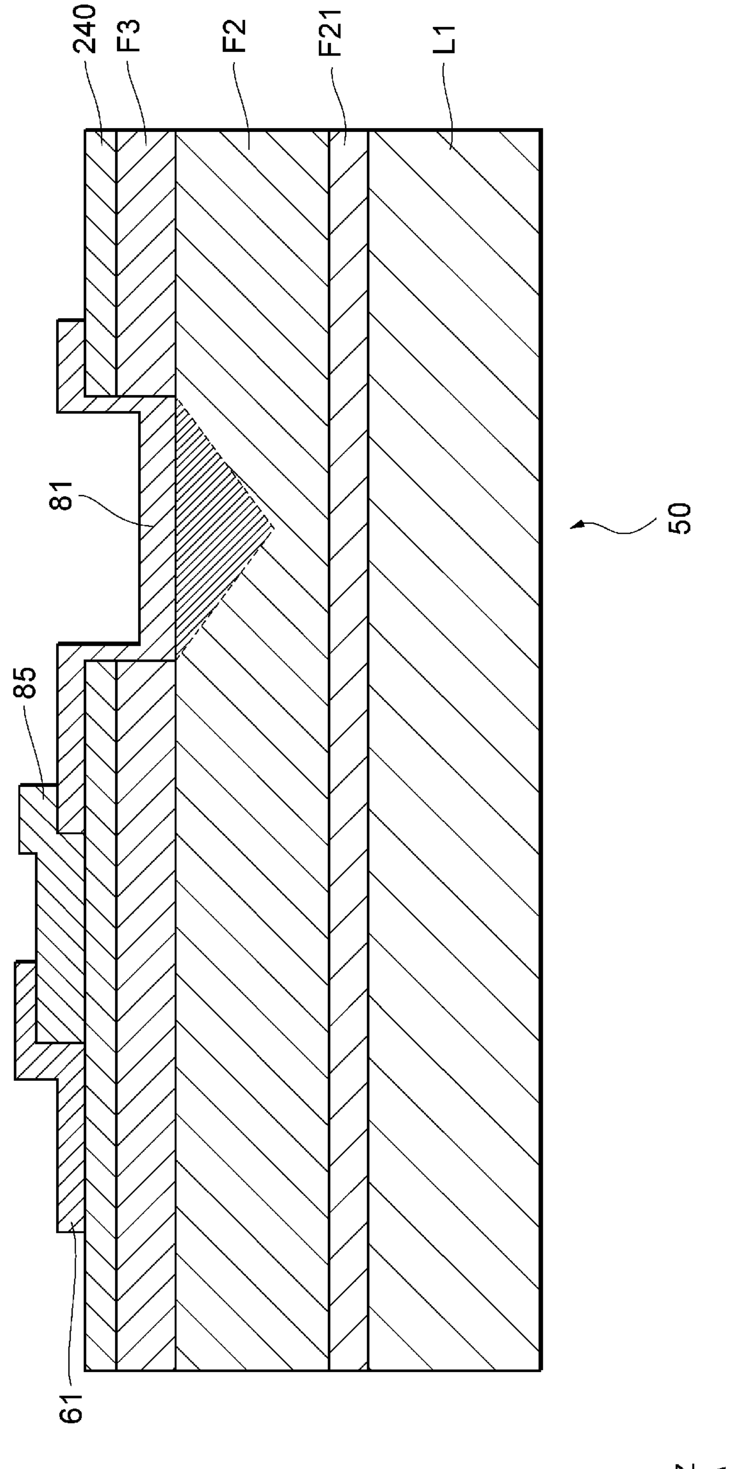
FIG. 8 is a main part enlarged sectional view for describing a first example of a step illustrated in FIG. 6.
Figure 9:
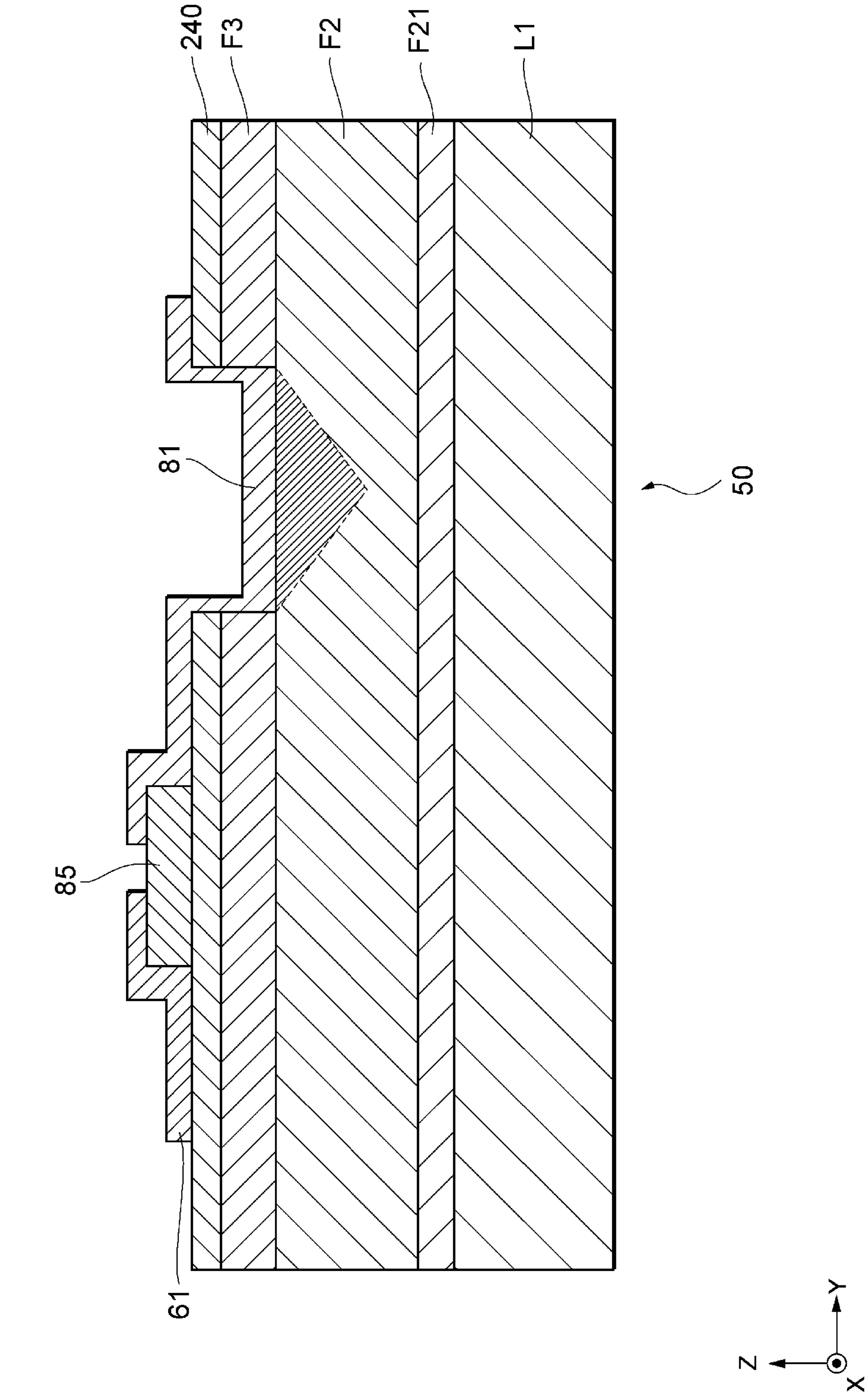
FIG. 9 is a main part enlarged sectional view for describing a second example of a step illustrated in FIG. 6.
Figure 10:
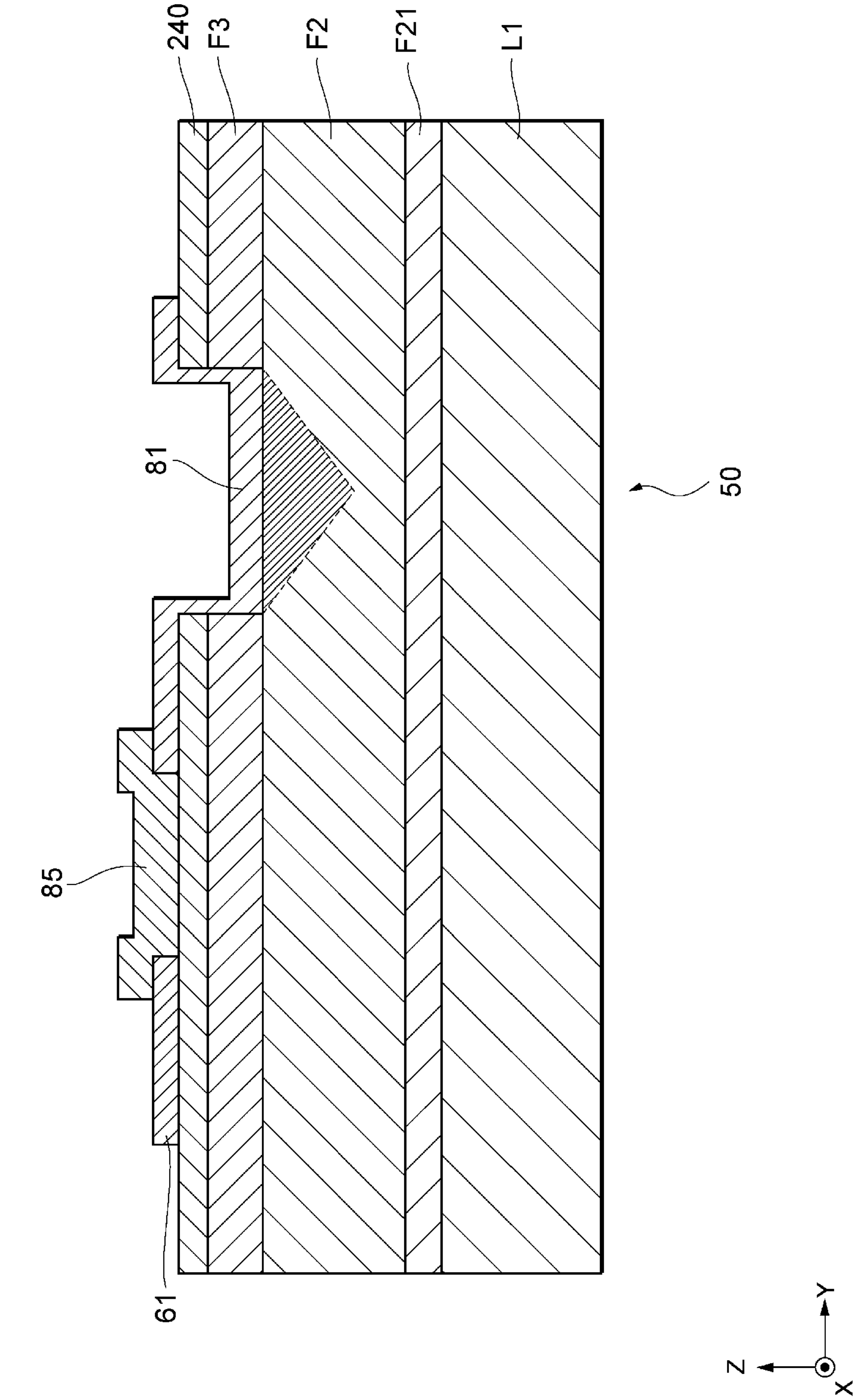
FIG. 10 is a main part enlarged sectional view for describing a third example of a step illustrated in FIG. 6.
Figure 11:
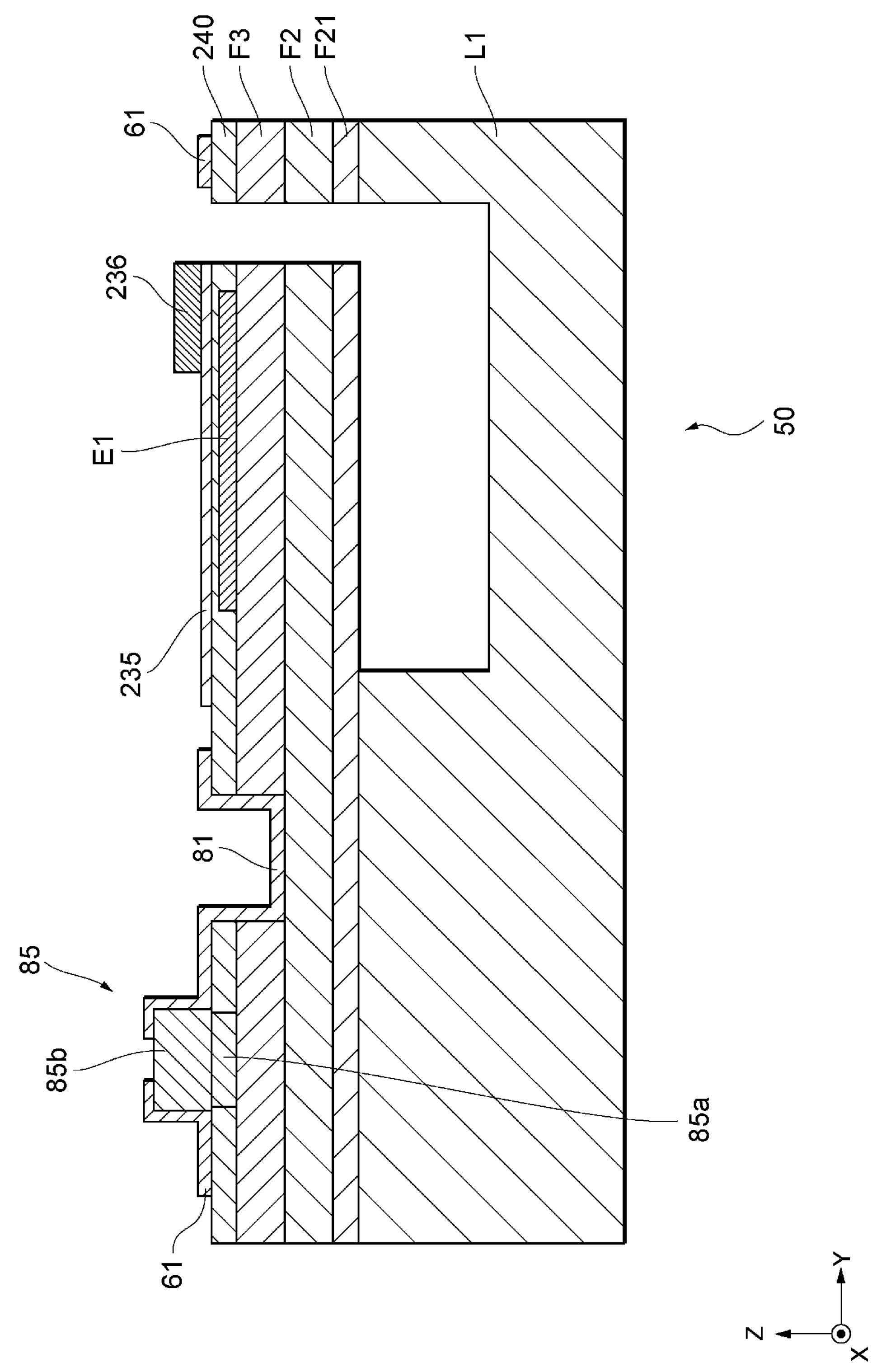
FIG. 11 is a main part enlarged sectional view for describing a fourth example of a step illustrated in FIG. 6.
Figure 13:
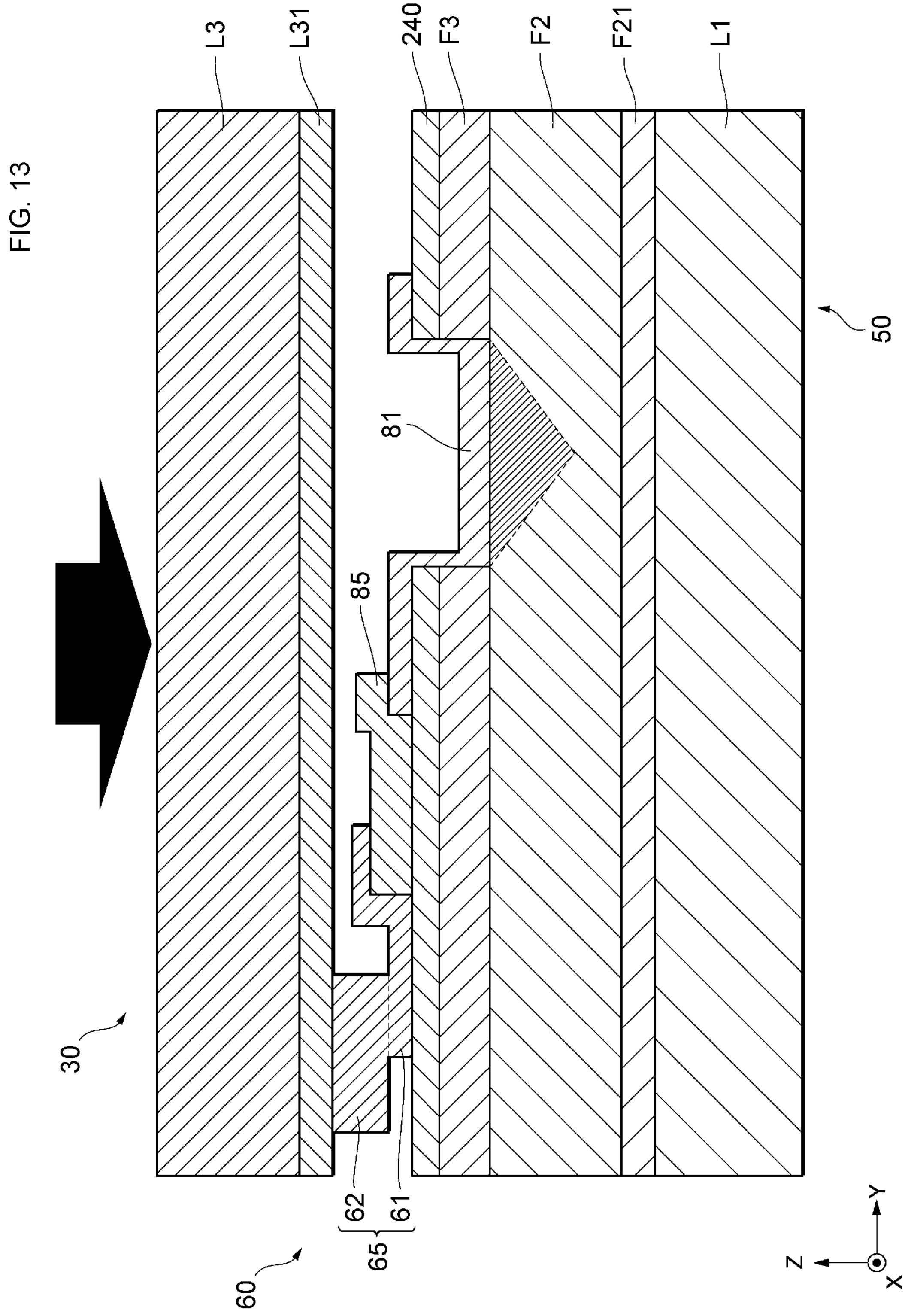
FIG. 13 is a main part enlarged plan view for describing a step illustrated in FIG. 6.

Next, a method of manufacturing a resonance device according to an embodiment of the present invention will be described while referring to FIGS. 6 to 13. FIG. 6 is a flowchart illustrating a method of manufacturing the resonance device 1 according to an embodiment. FIG. 7 is a sectional view for describing Step S301 illustrated in FIG. 6. FIG. 8 is a main part enlarged sectional view for describing a first example of Step S302 illustrated in FIG. 6. FIG. 9 is a main part enlarged sectional view for describing a second example of Step S302 illustrated in FIG. 6. FIG. 10 is a main part enlarged sectional view for describing a third example of Step S302 illustrated in FIG. 6. FIG. 11 is a main part enlarged sectional view for describing a fourth example of Step S302 illustrated in FIG. 6. FIG. 12 is a main part enlarged sectional view for describing Step S303 illustrated in FIG. 6. FIG. 13 is a main part enlarged sectional view for describing Step S304 illustrated in FIG. 6. For the sake of convenience, one resonance device 1 out of a plurality of resonance devices 1 manufactured using the manufacturing method is illustrated in FIGS. 7 to 13 and will be described.

As illustrated in FIG. 6, first, the MEMS substrate 50 and the top cover 30 are prepared (S301). Specifically, as illustrated in FIG. 7, the MEMS substrate 50, which includes the resonator 10, and the top cover 30 described above are prepared. However, the connection wiring line 70, which is illustrated in FIG. 4 and is for connecting the through electrode V3 and the resonator 10 to each other, is not formed yet. In addition, the bonding part 60, the wiring line layer 81, and the anti-diffusion layer 85 illustrated in FIG. 5 are similarly not formed yet.

Note that although an example is illustrated in which the MEMS substrate 50 and the top cover 30 are prepared in Step S301, the present invention is not limited to this example. For example, the step of preparing the MEMS substrate 50 and the top cover 30 may be divided into two separate steps, one for preparing the MEMS substrate 50 and the other for preparing the top cover 30.

Returning to FIG. 6, next, the first metal layer 61, the wiring line layer 81, and the anti-diffusion layer 85 are formed on the MEMS substrate 50 prepared in Step S301 (S302).

Specifically, as illustrated in FIG. 8, in the prepared MEMS substrate 50 (resonator 10), first, a hole is formed by removing the parasitic capacitance reducing film 240 and piezoelectric thin film F3 at a prescribed position using etching or another technique and then the wiring line layer 81 is formed by filling the formed hole with aluminum (Al) so that the aluminum is electrically connected to the Si substrate F2. Next, the anti-diffusion layer 85 is formed by stacking molybdenum (Mo) on the parasitic capacitance reducing film 240 and on an end portion of the wiring line layer 81, and then using etching or another technique to shape the stacked molybdenum (Mo) into a desired shape. The first metal layer 61 is formed by stacking aluminum (Al) on the parasitic capacitance reducing film 240 and on an end portion of the anti-diffusion layer 85, and then shaping the stacked aluminum (Al) into the desired shape using etching or another technique.

After forming the first metal layer 61, the MEMS substrate 50 may be subjected to a degassing heat treatment at a high temperature of around 435° C., for example. The first metal layer 61 having aluminum (Al) as a main component is negligibly affected by thermal diffusion even when the heat treatment is performed at a high temperature.

In FIG. 8, an example is illustrated in which the first metal layer 61, the wiring line layer 81, and the anti-diffusion layer 85 are formed on the MEMS substrate 50 in the order of the wiring line layer 81, the anti-diffusion layer 85, and the first metal layer 61, but the layers are not limited to this configuration. For example, as illustrated in FIG. 9, in the prepared MEMS substrate 50 (resonator 10), first, the anti-diffusion layer 85 may be formed by stacking molybdenum (Mo) on the parasitic capacitance reducing film 240, and then the wiring line layer 81 and the first metal layer 61 may be formed by forming a hole at a prescribed position in the parasitic capacitance reducing film 240 and filling the hole with aluminum (Al) and stacking aluminum (Al) on the parasitic capacitance reducing film 240 and on end portions of the anti-diffusion layer 85.

In addition, for example, as illustrated in FIG. 10, in the prepared MEMS substrate 50 (resonator 10), first, the wiring line layer 81 and the first metal layer 61 may be formed by forming a hole at a prescribed position in the parasitic capacitance reducing film 240 and filling the hole with aluminum (Al) and stacking aluminum (Al) on the parasitic capacitance reducing film 240, and next, the anti-diffusion layer 85 may be formed by stacking molybdenum (Mo) on the parasitic capacitance reducing film 240, on an end portion of the wiring line layer 81, and on an end portion of the first metal layer 61.

Thus, the first metal layer 61 and wiring line layer 81 can be formed above or below the anti-diffusion layer 85 by forming the first metal layer 61 and wiring line layer 81 before or after the formation of the anti-diffusion layer 85. Thus, the number of processes involved in forming the first metal layer 61 and the wiring line layer 81 can be reduced, thereby reducing the manufacturing costs.

Furthermore, as illustrated in FIG. 11, for example, the anti-diffusion layer 85 may be formed of two or more layers. In this case, the metal layer E1 that functions as the upper electrode of the resonator 10 and a first layer 85*a* of the anti-diffusion layer 85 are formed by stacking molybdenum (Mo) on the piezoelectric thin film F3. Next, the parasitic capacitance reducing film 240 is stacked on the piezoelectric thin film F3 so to cover the metal layer E1, and the protective film 235 is stacked at a prescribed position on the parasitic capacitance reducing film 240. Next, the frequency-adjusting film 236 and a second layer 85*b* of the anti-diffusion layer 85 are formed by stacking molybdenum (Mo) at a prescribed position on the protective film 235 and on the first layer 85*a*. Then, the wiring line layer 81 and the first metal layer 61 are formed by forming a hole at a prescribed position in the parasitic capacitance reducing film 240, filling the hole with aluminum (Al), and stacking aluminum (Al) on end portions of the parasitic capacitance reducing film 240 and the anti-diffusion layer 85.

Thus, the anti-diffusion layer 85 can be made thicker by forming the first layer 85*a* of the anti-diffusion layer 85 and the second layer 85*b* of the anti-diffusion layer 85 on the first layer 85*a*. This enables blocking performance of blocking diffusion of the metals constituting the bonding part 60 to be improved.

Step S302 does not have to be performed separately from Step S301. For example, formation of the first metal layer 61, the wiring line layer 81, and the anti-diffusion layer 85 may be performed as part of Step S301 or as part of the step of preparing the MEMS substrate 50 separately from Step S301.

Returning to FIG. 6, next, the second metal layer 62 is formed on the top cover 30 prepared in Step S301 (S303).

Specifically, as illustrated in FIG. 12, the second metal layer 62 is formed at a prescribed position by stacking germanium (Ge) on the surface of the silicon oxide film L31 on the rear surface of the top cover 30. The prescribed position at which the second metal layer 62 is formed is, for example, a position, on the rear surface of the top cover 30, that will face or substantially face the first metal layer 61 formed on the MEMS substrate 50 when the front surface of the MEMS substrate 50 and the rear surface of the top cover 30 are made to face each other.

After forming the second metal layer 62, the top cover 30 is subjected to a degassing heat treatment at a high temperature of around 435° C., for example. In this way, gas contained in the top cover 30 and the second metal layer 62 can be sufficiently released (evaporated) and the occurrence of outgassing can be thereby reduced.

Step S303 does not have to be performed separately from Step S301. For example, the formation of the second metal layer 62 may be performed as part of Step S301 or as part of the step of preparing the top cover 30, which is separate from Step S301.

Returning to FIG. 6, next, the MEMS substrate 50, on which the first metal layer 61, the wiring line layer 81, and the anti-diffusion layer 85 were formed in Step S302, and the top cover 30, on which the second metal layer 62 was formed in Step S303, are bonded together (S304). Step S304 includes forming the bonding part 60 that includes the eutectic layer 65 that is mainly composed of a eutectic alloy of the first metal that has aluminum (Al) as a main component and the second metal that is germanium (Ge).

Specifically, the positions of the MEMS substrate 50 and the top cover 30 are aligned so that the first metal layer 61 and the second metal layer 62 are aligned with each other. After being aligned, the MEMS substrate 50 and the top cover 30 are sandwiched between heaters or the like and subjected to a heat treatment in order to induce a eutectic reaction. At this time, the top cover 30 is moved toward the MEMS substrate 50. As a result, as illustrated in FIG. 13, the second metal layer 62 contacts the first metal layer 61.

The temperature used in the heat treatment for eutectic bonding is preferably greater than or equal to the temperature of the eutectic point and less than the melting point in the case of aluminum (Al) by itself, i.e., around 424° C. to less than 620° C. Furthermore, the heating time is preferably around 10 to 20 minutes. In this embodiment, a heat treatment is performed at a temperature of 430° C. to 500° C. for around 15 minutes.

During heating, the top cover 30 and the MEMS substrate 50 are pressed in a direction from the top cover 30 toward the MEMS substrate 50 as indicated by the black arrow in FIG. 13. The pressure applied during the pressing is preferably from around 5 MPa to around 25 MPa.

Furthermore, after the heat treatment for inducing eutectic bonding, a cooling treatment is performed, for example, by natural cooling. The cooling process is not limited to natural cooling, it is sufficient that the eutectic layer 65 is able to be formed at the bonding part 60, and various cooling temperatures and cooling speeds can be selected.

As a result of performing Step S304 illustrated in FIG. 6, the bonding part 60 including the eutectic layer 65, which has the eutectic alloy of the first metal and the second metal as a main component, is formed, as illustrated in FIG. 5.

In addition, the connection wiring line 70, which is illustrated in FIG. 4, for connecting the through electrode V3 and the resonator 10 to each other may be provided by forming an aluminum (Al) film at a prescribed position on the MEMS substrate 50 when forming the first metal layer 61, forming a germanium (Ge) film at a prescribed position on the top cover 30 when forming the second metal layer 62, and then eutectic bonding these layers together.

In this embodiment, an example is illustrated in which the wiring line layer 81 is disposed so as to be spaced apart from an end portion of the bonding part 60 in the MEMS substrate 50, but the present invention is not limited to this configuration. The position at which the wiring line layer 81 is formed and disposed may be changed as appropriate.

(Modifications)

Figure 14:
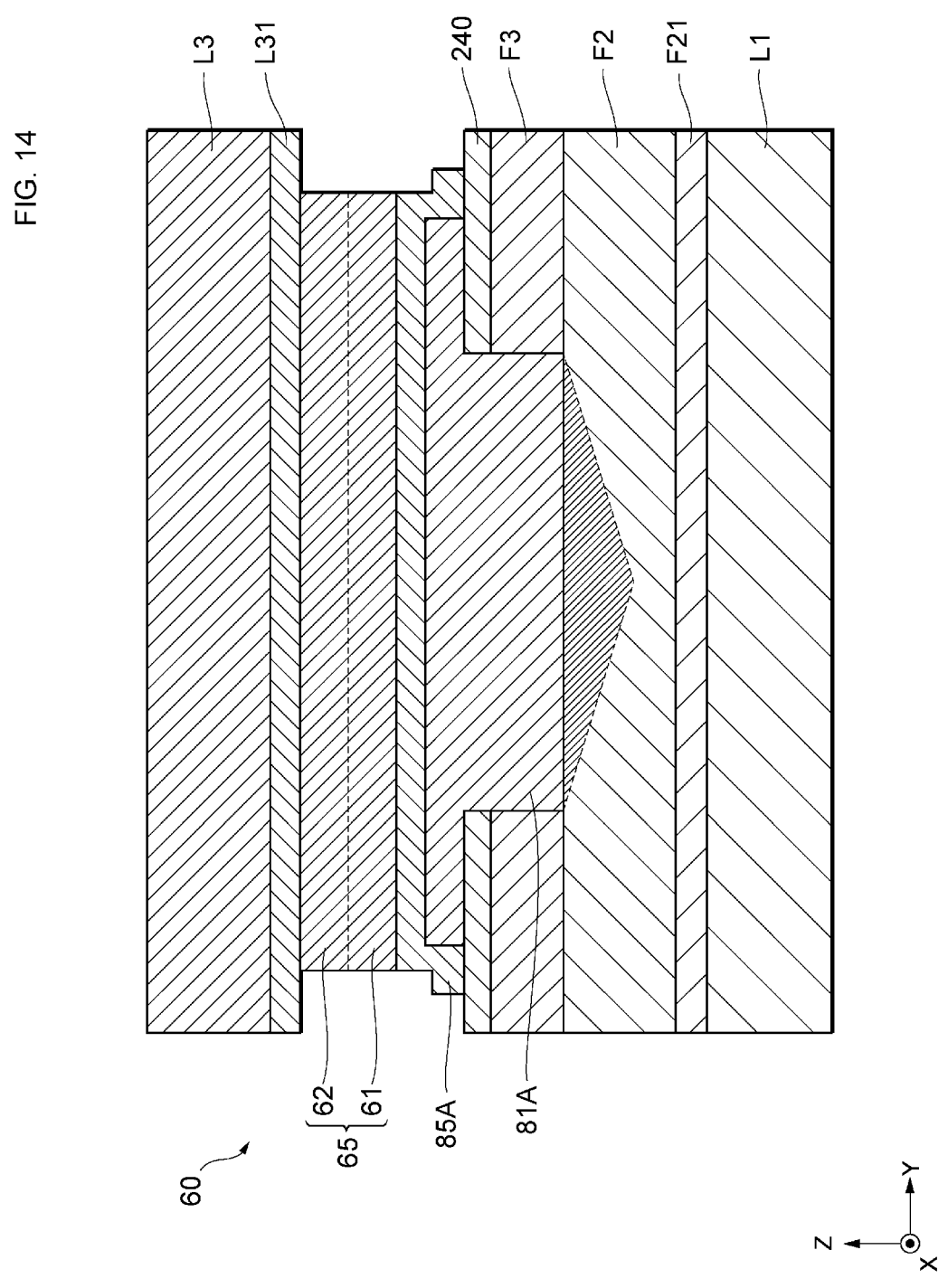

FIG. 14 is a main part enlarged sectional view schematically illustrating a modification of the configuration of the bonding part 60 and the region around the bonding part 60 illustrated in FIG. 5. Note that, in this modification, constituent parts that are the same as those of the bonding part 60 illustrated in FIG. 5 are denoted by the same symbols and description thereof is omitted as appropriate. In addition, the same operational effects resulting from the same configurations are not repeatedly described.

As illustrated in FIG. 14, a wiring line layer 81A and an anti-diffusion layer 85A may be provided underneath the bonding part 60. In this case, the wiring line layer 81A is formed along part of the periphery of the vibrating portion 120 in the resonator 10. The anti-diffusion layer 85A is formed on the wiring line layer 81A so as to cover the wiring line layer 81A. The first metal layer 61 is then formed on the anti-diffusion layer 85A. The bonding part 60 including the eutectic layer 65 is formed by eutectic bonding the first metal layer 61 on the anti-diffusion layer 85A formed on the MEMS substrate 50 and the second metal layer 62 formed on the rear surface of the top cover 30.

An exemplary embodiment of the present invention has been described above. In a resonance device according to an embodiment, a MEMS substrate includes a wiring line layer that is electrically connected to a lower electrode of a resonator. This allows the potential of a bonding part to be dropped to the reference potential (GND) of the resonance device via an anti-diffusion layer, and as a result, generation of a parasitic capacitance (stray capacitance) can be suppressed. The MEMS substrate includes an anti-diffusion layer that electrically connects the wiring line layer to the bonding part. Thus, diffusion of the metals constituting the bonding part into the wiring line layer when bonding the top cover and MEMS substrate to each other can be prevented by the anti-diffusion layer. Therefore, changes in the metal ratio of the bonding part caused by diffusion can be reduced, and bonding defects of the bonding part can be suppressed.

In the resonance device described above, the bonding part includes a eutectic layer, having as a main component, a eutectic alloy of a first metal of a first metal layer, which has aluminum (Al) as a main component, and a second metal of a second metal layer, which is germanium (Ge). Thus, a bonding part that is electrically conductive and has high bonding strength can be easily realized.

In the resonance device described above, the material of the anti-diffusion layer is molybdenum (Mo) or tungsten (W). This allows diffusion of aluminum (Al) and germanium (Ge) of the eutectic layer to be easily inhibited.

In the resonance device described above, the material of the Si substrate is degenerate silicon (Si). Thus, for example, by using a degenerate silicon substrate, which has a low resistance value, the Si substrate itself can serve as the lower electrode of the resonator.

In the resonance device described above, the material of the wiring line layer is a metal having aluminum (Al) as a main component. This allows an oxide film formed on the surface of the Si substrate, which serves as the lower electrode of the resonator, to be removed (reduced) by a heat treatment at a relatively low temperature, for example, 450° C.

In the resonance device described above, the wiring line layer is disposed so as to be spaced apart from an end portion of the bonding part in the MEMS substrate. This allows the anti-diffusion layer to be disposed between the bonding part and the wiring line layer. Therefore, the anti-diffusion layer can be made thinner than in the case where the anti-diffusion layer is formed directly below the bonding part, and the manufacturing cost of the resonance device can be reduced.

A resonance device manufacturing method according to an embodiment includes a step of preparing a MEMS substrate including a first metal layer, a resonator, a wiring line layer electrically connected to a Si substrate serving as a lower electrode of the resonator, and an anti-diffusion layer electrically connecting the wiring line layer to the first metal layer. This allows the potential of a bonding part to be dropped to the reference potential (GND) of the resonance device via an anti-diffusion layer, and as a result, generation of a parasitic capacitance (stray capacitance) can be suppressed. The MEMS substrate includes an anti-diffusion layer that electrically connects the wiring line layer to the bonding part. Thus, diffusion of the metals constituting the bonding part into the wiring line layer when bonding the top cover and MEMS substrate to each other can be prevented by the anti-diffusion layer. Therefore, changes in the metal ratio of the bonding part caused by diffusion can be reduced, and bonding defects of the bonding part can be suppressed.

In the resonance device manufacturing method described above, the step of preparing the MEMS substrate includes forming the first metal layer and the wiring line layer before or after forming the anti-diffusion layer. This allows the first metal layer and the wiring line layer to be formed above or below the anti-diffusion layer. Thus, the number of processes involved in forming the first metal layer and the wiring line layer can be reduced, thereby reducing the manufacturing costs.

In the resonance device manufacturing method described above, the step of preparing the MEMS substrate includes forming a first layer of the anti-diffusion layer and forming a second layer of the anti-diffusion layer on top of the first layer. This allows the anti-diffusion layer to be made thicker and improves the blocking performance for blocking diffusion of the metals constituting the bonding part.

In the resonance device manufacturing method described above, the step of preparing the MEMS substrate includes forming the wiring line layer at a position spaced apart from an end portion of the bonding part in the MEMS substrate. This allows the anti-diffusion layer to be disposed between the bonding part and the wiring line layer. Therefore, the anti-diffusion layer can be made thinner than in the case where the anti-diffusion layer is formed directly below the bonding part, and the manufacturing cost of the resonance device can be reduced.

In addition, in the resonance device manufacturing method described above, a first metal of the first metal layer is a metal having aluminum (Al) as a main component and a second metal of a second metal layer is germanium (Ge). Thus, a bonding part that is electrically conductive and has high bonding strength can be easily realized.

In the resonance device manufacturing method described above, the material of the anti-diffusion layer is molybdenum (Mo) or tungsten (W). This allows diffusion of aluminum (Al) and germanium (Ge) of the eutectic layer to be easily inhibited.

In the resonance device manufacturing method described above, the material of the Si substrate is degenerate silicon (Si). Thus, for example, by using a degenerate silicon substrate, which has a low resistance value, the Si substrate itself can serve as the lower electrode of the resonator.

In the resonance device manufacturing method described above, the material of the wiring line layer is a metal having aluminum (Al) as a main component. This allows an oxide film formed on the surface of the Si substrate, which serves as the lower electrode of the resonator, to be removed (reduced) by a heat treatment at a relatively low temperature, for example, 450° C.

The purpose of the embodiment described above is to enable easy understanding of the present invention and the embodiment is not to be interpreted as limiting the present invention. The present invention can be modified or improved without departing from the gist of the invention and equivalents to the present invention are also included in the present invention. In other words, appropriate design changes made to the embodiments by those skilled in the art are included in the scope of the present invention so long as the changes have the characteristics of the present invention. For example, the elements included in the embodiment and the arrangements, materials, conditions, shapes, sizes and so forth of the elements are not limited to those exemplified in the embodiment and can be changed as appropriate. In addition, the embodiment is merely an illustrative example and it goes without saying that parts of the configurations illustrated in different embodiments can be substituted for each other or combined with each other and these new configurations are also included in the scope of the present invention so long as the configurations have the characteristics of the present invention.

REFERENCE SIGNS LIST

1 . . . resonance device, 10 . . . resonator, 20 . . . bottom cover, 21 . . . recess, 22 . . . bottom plate, 23 . . . side wall, 30 . . . top cover, 31 . . . recess, 33 . . . side wall, 34 . . . getter layer, 50 . . . MEMS substrate, 60 . . . bonding part, 61 . . . first metal layer, 62 . . . second metal layer, 65 . . . eutectic layer, 70 . . . connection wiring line, 76A . . . contact electrode, 76B . . . contact electrode, 81, 81A . . . wiring line layer, 85, 85A . . . anti-diffusion layer, **85*a*** . . . first layer,

85*b* . . . second layer, 110 . . . holding arm, 120 . . . vibrating portion, 130 base portion, 131*a* . . . long side, 131A . . . front end, 131*b* long side, 131B . . . rear end, 131*c* . . . short side, 131*d* . . . short side, 135, 135A, 135B, 135C, 135D . . . vibrating arm, 140 . . . holding portion, 141 . . . voltage application part, 235 . . . protective film, 236 . . . frequency-adjusting film, 240 . . . parasitic capacitance reducing film, E1 . . . metal layer, E2 . . . metal layer, F2 . . . Si substrate, F3 . . . piezoelectric thin film, F21 . . . silicon oxide layer, G . . . weight portion, L1 . . . Si wafer, L3 . . . Si substrate, L31 . . . silicon oxide film, P . . . virtual plane, T4 . . . terminal, V1 . . . via, V2 . . . via, V3 . . . through electrode.

The invention claimed is:

1. A resonance device comprising:

a first substrate that includes a resonator having a lower electrode and a wiring line layer electrically connected to the lower electrode;

a second substrate;

a bonding part that is electrically conductive, bonds the first substrate and the second substrate to each other and is electrically connected to a ground reference potential of the resonance device; and an anti-diffusion layer electrically connecting the wiring line layer and the bonding part to each other.

2. The resonance device according to claim 1, wherein the bonding part includes a eutectic layer having a eutectic alloy as a main component.

3. The resonance device according to claim 2, wherein the eutectic alloy consists of a first metal having aluminum as a main component and a second metal that is germanium.

4. The resonance device according to claim 3, wherein a material of the anti-diffusion layer is molybdenum or tungsten.

5. The resonance device according to claim 1, wherein a material of the lower electrode is degenerate silicon.

6. The resonance device according to claim 5, wherein a material of the wiring line layer is a metal having aluminum as a main component.

7. The resonance device according to claim 1, wherein the wiring line layer is spaced apart from an end portion of the bonding part in the first substrate.

8. The resonance device according to claim 1, wherein the anti-diffusion layer consists of a metal that has low diffusivity with respect to a metal of the bonding part.

9. A resonance device manufacturing method comprising:

preparing a first substrate including a first metal layer, a resonator, a wiring line layer electrically connected to a lower electrode of the resonator, and an anti-diffusion layer electrically connecting the wiring line layer to the first metal layer;

preparing a second substrate including a second metal layer;

bonding the first substrate and the second substrate to each other with a bonding part that includes a eutectic layer, the eutectic layer having a eutectic alloy of a first metal of the first metal layer and a second metal of the second metal layer as a main component; and electrically connecting the bonding part to a ground reference potential of the resonance device.

10. The resonance device manufacturing method according to claim 9, wherein the preparing of the first substrate includes forming the first metal layer and the wiring line layer before or after forming the anti-diffusion layer.

11. The resonance device manufacturing method according to claim 9, wherein the preparing of the first substrate includes forming a first layer of the anti-diffusion layer and forming a second layer of the anti-diffusion layer on top of the first layer.

12. The resonance device manufacturing method according to claim 9, wherein the preparing of the first substrate includes forming the wiring line layer at a position spaced apart from an end portion of the first metal layer in the first substrate.

13. The resonance device manufacturing method according to claim 9, wherein the first metal is a metal having aluminum as a main component, and the second metal is germanium.

14. The resonance device manufacturing method according to claim 13, wherein a material of the anti-diffusion layer is molybdenum or tungsten.

15. The resonance device manufacturing method according to claim 9, wherein a material of the lower electrode is degenerate silicon.

16. The resonance device manufacturing method according to claim 15, wherein a material of the wiring line layer is a metal having aluminum as a main component.

17. The resonance device manufacturing method according to claim 9, wherein the anti-diffusion layer consists of a metal that has low diffusivity with respect to a metal of the bonding part.

18. A resonance device comprising:

a first substrate that includes a resonator having a lower electrode and a wiring line layer electrically connected to the lower electrode;

a second substrate;

a bonding part that is electrically conductive and bonds the first substrate and the second substrate to each other;

an anti-diffusion layer electrically connecting the wiring line layer and the bonding part to each other, wherein the bonding part includes a eutectic layer having a eutectic alloy as a main component, wherein the eutectic alloy consists of a first metal having aluminum as a main component and a second metal that is germanium, wherein a material of the anti-diffusion layer is molybdenum or tungsten, wherein a material of the lower electrode is degenerate silicon, and wherein a material of the wiring line layer is a metal having aluminum as a main component.

* * * * *